United States Patent
Bock

(10) Patent No.: US 9,991,878 B2
(45) Date of Patent: Jun. 5, 2018

(54) CROSS-POINT SHIFTING TECHNIQUES

(71) Applicant: TEXAS INSTRUMENTS DEUTSCHLAND GmbH, Freising (DE)

(72) Inventor: Andreas Bock, Isernhagen (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days. days.

(21) Appl. No.: 14/816,275

(22) Filed: Aug. 3, 2015

(65) Prior Publication Data

US 2016/0036422 A1 Feb. 4, 2016

Related U.S. Application Data

(60) Provisional application No. 62/032,227, filed on Aug. 1, 2014.

(51) Int. Cl.
*H04B 10/00* (2013.01)
*H03K 5/1252* (2006.01)
*H04B 10/58* (2013.01)

(52) U.S. Cl.
CPC ........... *H03K 5/1252* (2013.01); *H04B 10/58* (2013.01)

(58) Field of Classification Search
CPC ................ H03K 5/1252; H04B 10/58
See application file for complete search history.

(56) References Cited

U.S. PATENT DOCUMENTS

| 6,084,478 A * | 7/2000 | Mayampurath | H03G 3/3084 250/214 A |
| 7,184,671 B2 * | 2/2007 | Wang | H04B 10/572 398/195 |
| 2005/0175350 A1 * | 8/2005 | Hartzell | G02B 6/4246 398/135 |
| 2008/0183098 A1 * | 7/2008 | Denison | A61B 5/0002 600/547 |
| 2013/0308669 A1 * | 11/2013 | Nogami | H01S 5/0427 372/38.07 |
| 2016/0036422 A1 * | 2/2016 | Bock | H04B 10/58 398/201 |

OTHER PUBLICATIONS

Panarin, Yuri, "Analog Multipliers," Lecture Notes, Dublin Institute of Technology, School of Electronic and Communications (2003) (17 pages).

(Continued)

*Primary Examiner* — Danny Leung
(74) *Attorney, Agent, or Firm* — Gregory J. Albin; Charles A. Brill; Frank D. Cimino

(57) ABSTRACT

This disclosure describes techniques for shifting the cross-point of a digital signal in an optical transmitter. The cross-point shifting techniques may use multiple differential transconductors with their common polarity outputs coupled together to shift the cross-point of a signal. Using multiple differential transconductors in this manner may increase the balance between the positive and negative polarities of the resulting cross-point shifted signal relative to other types of cross-point shifting techniques, which may improve the quality of an optical signal generated by an optical transmitter.

11 Claims, 8 Drawing Sheets

(56) References Cited

OTHER PUBLICATIONS

Gilbert, Barrie, "Current Mode, Voltage Mode, or Free Mode? A Few Sage Suggestions," Analog Integrated Circuits and Signal Processing, 38 (2004) pp. 83-101 (19 pages).
Anritsu Corporation, "Understanding Eye Pattern Measurements," Application Note No. 11410-00533, Rev. A (2010) (20 pages).
On Semiconductor, "Understanding Data Eye Diagram Methodology for Analyzing High Speed Digital Signals," Semiconductor Component Industries, LLC, Publication Order No. AND9075/D (2014) (7 pages).
Analog Devices, "Analog Multipliers," MT-079 Tutorial, Analog Devices, Inc. (2009) (8 pages).
Papavassiliou, Christos, "Translinear Circuits," Lecture Notes, Imperial College, Electrical & Electronic Engineering 2007) (22 pages).

\* cited by examiner

US 9,991,878 B2

CROSS-POINT SHIFTING TECHNIQUES

This application claims the benefit of U.S. Provisional Application No. 62/032,227, filed Aug. 1, 2014, the entire content of which is incorporated herein by reference.

TECHNICAL FIELD

The disclosure relates to electrical circuits, and in particular, to cross-point adjustment circuits.

BACKGROUND

Electrical-to-optical converters are used to convert an electrical signal into an optical signal for optical communication. The optical signal may be transmitted from a transmitter to a receiver via an optical transmission medium, such as, for example, optical fibers. Electrical-to-optical converters may introduce distortion into the resulting optical signal, which may degrade performance of an optical transceiver.

SUMMARY

According to some aspects of this disclosure, an integrated circuit includes a differential current source having a differential current output. The integrated circuit further includes a differential current-to-voltage converter having a differential input coupled to the differential current output of the differential current source, and a differential voltage output. The integrated circuit further includes a first differential transconductor having a first input coupled to a first input voltage component lead, a second input coupled to a first terminal of the differential voltage output, and a differential current output. The integrated circuit further includes a second differential transconductor having a first input coupled to a second terminal of the differential voltage output, a second input coupled to a second input voltage component lead, and a differential current output. A first terminal of the differential current output of the first differential transconductor is coupled to a first terminal of the differential current output of the second differential transconductor. A second terminal of the differential current output of the first differential transconductor is coupled to a second terminal of the differential current output of the second differential transconductor.

According to additional aspects of this disclosure, a method includes generating a first differential current. The method further includes generating a differential voltage based on the first differential current. The method further includes generating a second differential current based on a first component of an input signal and a first component of the differential voltage. The method further includes generating a third differential current based on a second component of the input signal and a second component of the differential voltage. The method further includes generating a first component of a fourth differential current based on a first component of the second differential current and a first component of the third differential current. The method further includes generating a second component of the fourth differential current based on a second component of the second differential current and a second component of the third differential current.

According to additional aspects of this disclosure, a device includes circuitry configured to generate a first differential current. The circuitry is further configured to generate a differential voltage based on the first differential current. The circuitry is further configured to generate a second differential current based on a first component of an input signal and a first component of the differential voltage. The circuitry is further configured to generate a third differential current based on a second component of the input signal and a second component of the differential voltage. The circuitry is further configured to generate a first component of a fourth differential current based on a first component of the second differential current and a first component of the third differential current. The circuitry is further configured to generate a second component of the fourth differential current based on a second component of the second differential current and a second component of the third differential current.

DETAILED DESCRIPTION

Figure 1:
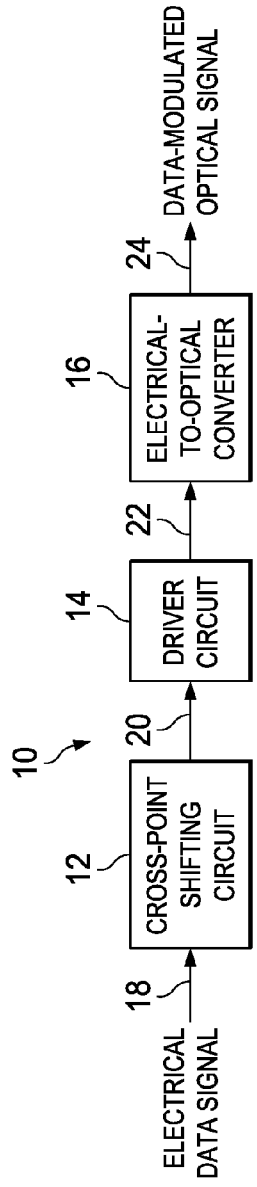
FIG. 1 is a block diagram illustrating an example optical transmitter according to this disclosure.

This disclosure describes techniques for shifting the cross-point of a digital signal in an optical transmitter. The cross-point shifting techniques of this disclosure may use multiple differential transconductors with their common polarity outputs coupled together to shift the cross-point of a signal. Using multiple differential transconductors in this manner may increase the balance between the positive and negative polarities of the resulting cross-point shifted signal relative to other types of cross-point shifting techniques. Increasing the degree of polarity balance in the cross-point shifted signal may reduce the amount of distortion produced by subsequent stages of an optical transmitter. In this way, the quality of an optical signal generated by an optical transmitter may be improved.

In some examples, each of the transconductors may be a long-tailed pair of transistors having a first input that is coupled to a respective input voltage component and a second input that is coupled to a respective reference voltage. Each of the transconductors may generate one or more currents that have amplitudes that are determined based on a relationship (e.g., a difference) between the voltages at their respective inputs.

In cases where the difference between the input voltage component and the reference voltage received by one of transconductors is relatively small, the magnitude of each of the output currents of the transconductors may be approximately equal to a difference between the input voltage component and the reference voltage. By adjusting the magnitudes of the reference voltages, the low-to-high and high-to-low transitions of the output current for the transconductors may be shifted upwards or downwards relative to the low-to-high and high-to-low transitions in the input voltage, thereby shifting the cross-point of the signal.

When the difference between the input voltage component and the reference voltage received by one of transconductors is relatively large, then the sum of the output currents produced by the transconductor may be limited by the amount of bias current in the long-tailed pair of transistors, and substantially all of the bias current may be steered to one output or the other of the transconductor depending on whether the respective input voltage component is greater than or less than the respective reference voltage.

The output current limiting provided by the long-tailed pairs of transistors may allow the transitions in the input voltage signal to be shifted upwards or downwards while maintaining approximately the same logic zero and logic one levels. This may allow the magnitudes of the positive and negative polarities of the resulting cross-point shifted signal to remain substantially balanced over a wide range of shifting magnitudes. Maintaining relatively balanced positive and negative polarities of the cross-point shifted signal may reduce the amount of distortion produced by subsequent stages of an optical transmitter. In this way, the quality of an optical signal generated by an optical transmitter may be improved.

In some examples, the reference voltages may be generated by a current-to-voltage converter that is formed from a long-tailed pair of transistors with feedback from the collectors to the bases of the transistors. In such examples, each of the reference voltages may be determined by adjusting the relationship between the magnitudes of the currents that are input into the current-to-voltage converter. Because long-tailed pairs of transistors with the same type of transistors are used for both the current-to-voltage converter and the differential transconductors, the transfer functions (though non-linear) may be inversely related. Because the transfer functions are inversely related, the amount of cross-point shifting may be controlled in a relatively linear manner even though the transfer functions of the individual components may be non-linear.

In some examples, a control circuit may control the common mode of the currents that are input into the current-to-voltage converter so as to cause the common mode voltage for the input signal components to be substantially equal to the common mode voltage of the reference voltages. When the common mode voltages are equal, the transistors in the current-to-voltage converter and the differential transconductors may form a virtual two-quadrant multiplier and/or a virtual translinear circuit. This may allow the amount of cross-point shifting to be controlled in a relatively linear manner even though non-linear devices may be used.

FIG. 1 is a block diagram illustrating an example optical transmitter 10 according to this disclosure. Optical transmitter 10 includes a cross-point shifting circuit 12, a driver circuit 14, an electrical-to-optical converter 16, electrical connections 18, 20, 22, and an optical connection 24.

An input of cross-point shifting circuit 12 is coupled to an electrical data signal via connection 18. An output of cross-point shifting circuit 12 is coupled to an input of driver circuit 14 via connection 20. An output of driver circuit 14 is coupled to an input of electrical-to-optical converter 16 via connection 22. An output of electrical-to-optical converter 16 is coupled to optical connection 24, which may carry a data-modulated optical signal.

In some examples, connections 18, 20 may be differential connections, and connection 22 may be a single-ended connection. A single-ended connection may be implemented as a single lead. A differential connection may be implemented with a differential pair of leads. Optical connection 24 may be any type of medium that is configured to carry a data-modulated optical signal. Example mediums for optical connection 24 may include one or more optical fibers and/or a laser light.

Cross-point shifting circuit 12 receives an electrical data signal via connection 18, generates a cross-point shifted signal based on the electrical data signal, and outputs the cross-point shifted signal via connection 20. In some examples, the electrical data signal may be a differential digital signal, and cross-point shifting circuit 12 may shift the cross-point of the electrical data signal to generate the cross-point shifted signal. Driver circuit 14 receives the cross-point shifted signal via connection 20, generates a driving signal based on the cross-point shifted signal, and outputs the driving signal via connection 22. In some examples, driver circuit 14 may amplify the cross-point shifted signal to generate the driving signal and/or convert the cross-point shifted signal from a differential signal to a single-ended signal to generate the driving signal. Electrical-to-optical converter 16 receives the driving signal via connection 22, generates a data-modulated optical signal based on the driving signal, and outputs the data-modulated optical signal via optical connection 24.

In some examples, electrical-to-optical converter 16 may include a light source, and may directly modulate the light source based on the driving signal received via connection 22 to produce the data-modulated optical signal. In further examples, electrical-to-optical converter 16 may include an optical modulator that receives an incoming light source and modulates the incoming light source based on the driving signal received via connection 22 to produce the data-modulated optical signal. In some examples, electrical-to-optical converter 16 may be a directly-modulated laser. In further examples, electrical-to-optical converter 16 may be an electro-absorption modulator.

Figure 2:
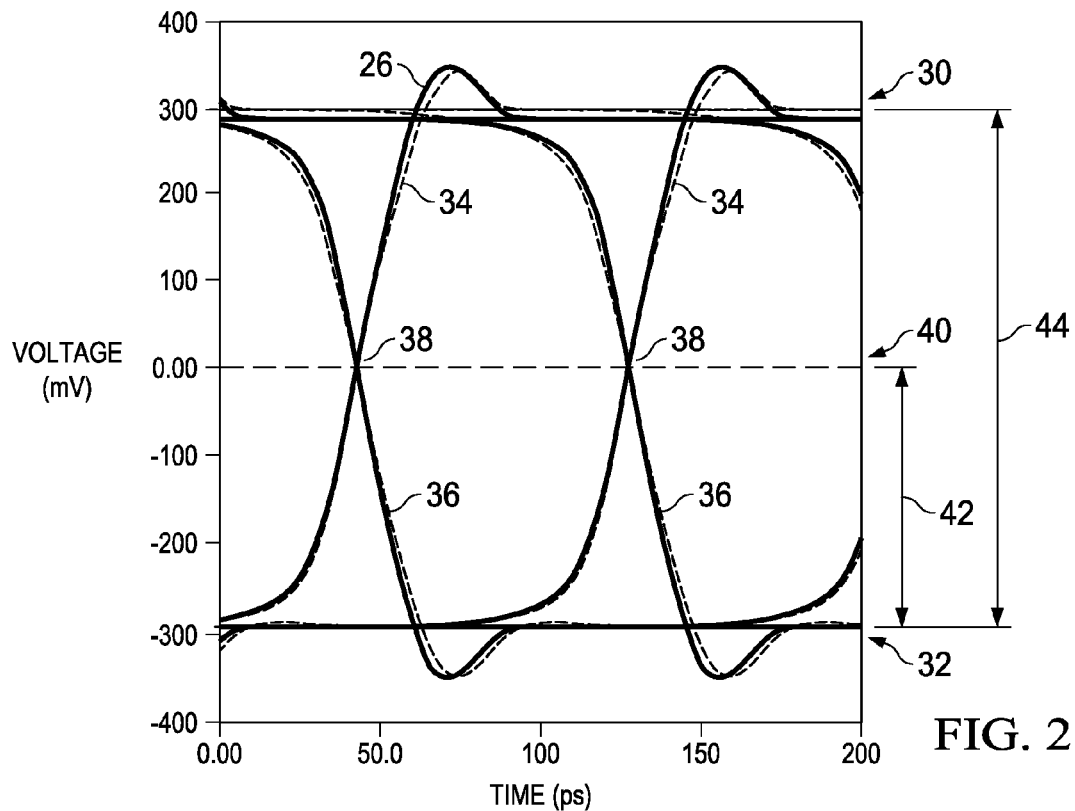
FIGS. 2 and 3 are eye diagrams depicting example electrical signals that may be transmitted via an optical transmitter according to this disclosure.
Figure 3:
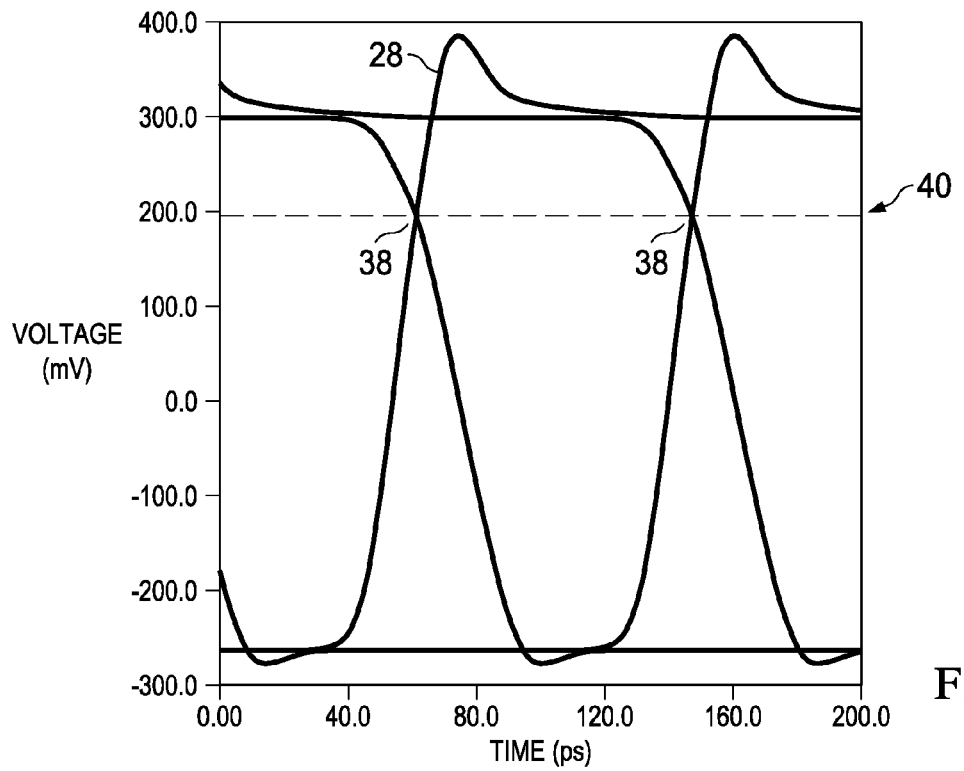

FIGS. 2 and 3 are eye diagrams depicting example waveforms 26, 28 that may be transmitted via an optical transmitter according to this disclosure. In some examples, waveforms 26, 28 may correspond to waveforms produced by cross-point shifting circuit 12 and/or driver circuit 14. An eye diagram may refer to a diagram that includes a plurality of finite width samples of a digital signal superimposed on top of each other where the width of each of the samples corresponds to a multiple of the symbol period.

As shown in FIG. 2, the eye diagram includes a one level 30 and a zero level 32. The one level 30 may refer to the mean value of logic ones in the digital signal, and the zero level 32 may refer to the mean value of logic zeros in the digital signal. The eye diagram also includes low-to-high transitions 34 that correspond to transitions from a logic zero state to a logic one state, and high-to-low transitions 36 that correspond to transitions from a logic one state to a logic zero state. The points at which low-to-high transitions 34 and high-to-low transitions 36 intersect may be referred to as cross-points 38. The level (e.g., voltage level) at which the cross-points 38 occur is denoted by cross-point level 40.

The cross-point level of a signal may refer to the level at which the high-to-low and low-to-high signal transitions of the signal cross each other (i.e., are equal to each other)

relative to the high and low logic levels of the signal when multiple periodic samples of the signal are superimposed on top of each other. In some cases, the cross-point level may be expressed as a percentage defined as the ratio of the distance 42 between the cross-point level 40 and the zero level 32 to the distance 44 between the one level 30 and the zero level 32. In such cases, the cross-point level may be alternatively referred to as a cross-point percentage.

In FIG. 2, the cross-point level is approximately 50%, which is typically considered an ideal level for receivers. Deviations from a 50% cross-point level may result in degradation of the quality of the electrical signal.

The cross-point level may correspond to the amount of duty cycle distortion in a digital signal. Duty cycle distortion may refer to the duration of logic one pulses relative to the duration of logic zero pulses. If the logic one and zero pulses have approximately equal durations, then no duty cycle distortion is said to occur, and such a state may correspond to a 50% cross-point level. On the other hand, if the logic one and zero pulses have different durations, then duty cycle distortion is said to occur.

FIG. 3 illustrates an example of a case where the cross-point level 40 (corresponding to cross-points 38) is shifted upwards away from the 50% ideal level. This shifting of the cross-point level 40 causes duty cycle distortion to occur. In particular, the logic one pulses in FIG. 3 have an average duration that is longer than that of the zero pulses. This duty cycle distortion may lead to a degradation of the quality of the electrical signal.

Returning to FIG. 1, electrical-to-optical converter 16 may introduce cross-point distortion into the resulting data-modulated optical signal, which may degrade the performance of an optical receiver. Cross-point distortion may refer to the shifting of the cross-point level of the waveform away from a 50% point, which may introduce duty cycle distortion. Cross-point shifting circuit 12 may reduce the cross-point distortion by introducing pre-distortion into the cross-point shifted signal and the driving signal. Pre-distortion may refer to the shifting of the cross-point in a direction opposite to the distortion introduced by electrical-to-optical converter 16 prior to the signal being processed by electrical-to-optical converter 16.

Some techniques for shifting the cross-point may cause the positive and negative polarities of the resulting cross-point shifted signal to be unbalanced. A signal with unbalanced polarities may refer to a signal where the positive amplitude of the signal is different than the negative amplitude of the signal. In other words, the signal is not symmetric about the zero axis. Some electrical-to-optical converters may have switching points that depend upon receiving a relatively balanced driving signal. As such, cross-point shifting techniques that produce an unbalanced signal may introduce signal distortion and/or prevent electrical-to-optical converter 16 from properly switching.

According to this disclosure, cross-point shifting circuit 12 may use multiple differential transconductors with their common polarity outputs coupled together to shift the cross-point of a signal. Using multiple differential transconductors in this manner may increase the balance between the positive and negative polarities of the resulting cross-point shifted signal relative to other types of cross-point shifting techniques. Increasing the degree of polarity balance in the cross-point shifted signal may reduce the amount of distortion produced by electrical-to-optical converter 16 of optical transmitter 10. In this way, the quality of an optical signal generated by optical transmitter 10 may be improved.

Figure 4:
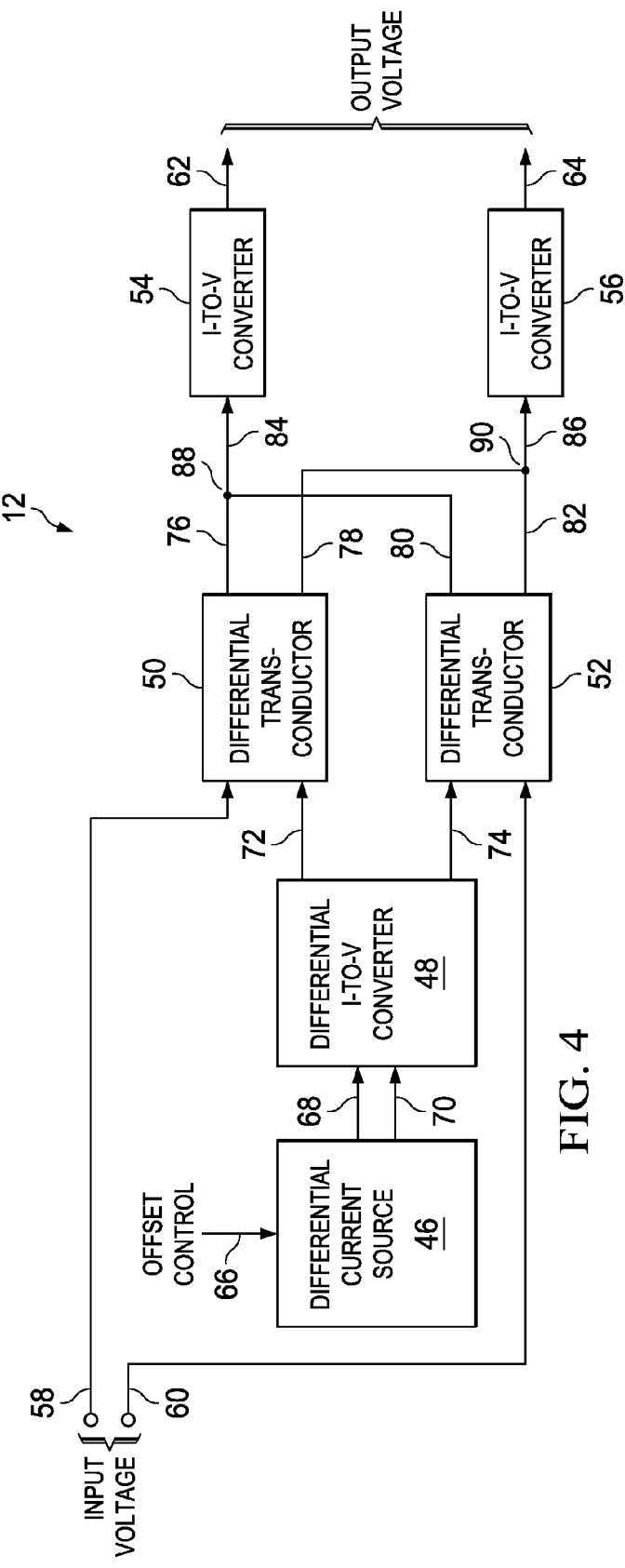
FIG. 4 is a block diagram illustrating an example cross-point shifting circuit according to this disclosure.

FIG. 4 is a block diagram illustrating an example cross-point shifting circuit 12 according to this disclosure. Cross-point shifting circuit 12 includes a differential current source 46, a differential current-to-voltage converter 48, differential transconductors 50, 52, current-to-voltage converters 54, 56, input voltage leads 58, 60, output voltage leads 62, 64, an offset control lead 66, leads 68, 70, 72, 74, 76, 78, 80, 82, 84, 86, and junctions 88, 90.

An input of differential current source 46 is coupled to offset control lead 66. A positive polarity output of differential current source 46 is coupled to a positive polarity input of differential current-to-voltage converter 48 via lead 68. A negative polarity output of differential current source 46 is coupled to a negative polarity input of differential current-to-voltage converter 48 via lead 70.

A positive polarity output of differential current-to-voltage converter 48 is coupled to a negative polarity input of differential transconductor 50 via lead 72. A negative polarity output of differential current-to-voltage converter 48 is coupled to a positive polarity input of differential transconductor 52 via lead 74. A positive polarity input of differential transconductor 50 is coupled to a positive polarity input voltage lead 58. A negative polarity input of differential transconductor 52 is coupled to a negative polarity input voltage lead 60.

A positive polarity output of differential transconductor 50 is coupled to junction 88 via lead 76. A negative polarity output of differential transconductor 50 is coupled to junction 90 via lead 78. A positive polarity output of differential transconductor 52 is coupled to junction 88 via lead 80. A negative polarity output of differential transconductor 52 is coupled to junction 90 via lead 82. Junction 88 is coupled to an input of current-to-voltage converter 54 via lead 84. Junction 90 is coupled to an input of current-to-voltage converter 56 via lead 86. An output of current-to-voltage converter 54 is coupled to the positive polarity output voltage lead 62. An output of current-to-voltage converter 56 is coupled to the negative polarity output voltage lead 64.

During operation, differential current source 46 may receive an offset control signal via offset control lead 66, generate a differential current based on the offset control signal, and output the differential current at leads 68, 70. Differential current-to-voltage converter 48 may receive the differential current via leads 68, 70, generate a differential voltage based on the differential current, and output the differential voltage via leads 72, 74. Differential transconductor 50 may receive a positive polarity component of the differential input signal and a positive polarity component of the differential voltage produced by differential current-to-voltage converter 48, which together may form a differential voltage, generate a differential current based on the differential voltage, and output the differential current via leads 76, 78. Differential transconductor 50 may receive a negative polarity component of the differential input signal and a negative polarity component of the differential voltage produced by differential current-to-voltage converter 48, which together may form a differential voltage, generate a differential current based on the differential voltage, and output the differential current via leads 80, 82.

Junction 88 may combine a positive polarity component of the differential current produced by differential transconductor 50 and a positive polarity component of the differential current produced by differential transconductor 52 to generate a positive polarity component of a differential current at lead 84. Junction 88 may combine a negative polarity component of the differential current produced by differential transconductor 50 and a negative polarity component of the differential current produced by differential transconductor 52 to generate a negative polarity component of the differential current at lead 86. Current-to-voltage converters 54, 56 may collectively receive a differential current via leads 84, 86, generate a differential output voltage based on the differential current, and output the differential output voltage via output voltage leads 62, 64. Specifically, current-to-voltage converter 54 may generate a positive polarity component of the differential output voltage based on the positive polarity component of the differential current, and current-to-voltage converter 56 may generate a negative polarity component of the differential output voltage based on the negative polarity component of the differential current.

A differential signal may have positive and negative polarity components that are carried by different leads. Each of the polarity components of a differential signal may have a common mode subcomponent and a differential subcomponent. For a positive polarity component, the differential subcomponent may be added to the common mode subcomponent. For the negative polarity component, the differential subcomponent may be subtracted from the common mode subcomponent. As such, in some instances, the positive and negative polarity components of a differential signal may both have positive or negative magnitudes depending on the common mode component of the differential signals.

In some examples, the offset control signal may correspond to a target amount of cross-point shifting to be applied to the differential input voltage signal carried by leads 58, 60. Differential current source 46 may generate the differential current at leads 68, 70 such that a difference between each of the components carried by leads 68, 70 is a function of the target amount of cross-point shifting. In some examples, differential current source 46 may generate the differential current such that each of the components of the differential current has a common mode subcomponent and a differential subcomponent where the magnitude of the differential subcomponent is determined at least in part by the offset control signal.

Differential current-to-voltage converter 48 may generate the differential voltage at leads 72, 74 such that the differential voltage is indicative of a difference between the components of the differential current carried by leads 68, 70. In some examples, the difference between the components of the differential voltage produced at leads 72, 74 may be indicative of the difference between the components of the differential current carried by leads 68, 70. In further examples, the difference between the components of the differential voltage produced at leads 72, 74 may be substantially proportional the difference between the components of the differential current carried by leads 68, 70. In additional examples, the difference between the components of the differential voltage produced at leads 72, 74 may be a function of the ratio of the components of the differential current carried by leads 68, 70. For example, the difference between the components of the differential voltage produced at leads 72, 74 may be a logarithmic function of the ratio of the components of the differential current carried by leads 68, 70.

Differential transconductor 50 may generate the differential current at leads 76, 78 such that the differential current is indicative of a difference between the components of the differential voltage carried by leads 58, 72 (i.e., a difference between a positive polarity component of the input voltage carried by input voltage leads 58, 60 and a positive polarity component of the differential voltage carried by leads 72, 74). In some examples, the difference between the components of the differential current carried by leads 76, 78 may be indicative of the difference between the components of the differential voltage carried by leads 58, 72. In further examples, the difference between the components of the differential current carried by leads 76, 78 may be substantially proportional the difference between the components of the differential voltage carried by leads 58, 72. In additional examples, the ratio of the components of the differential current carried by leads 76, 78 may be a function of the difference of the components of the differential voltage carried by leads 58, 72. For example, the ratio of the components of the differential current carried by leads 76, 78 may be an exponential function of the difference of the components of the differential voltage carried by leads 58, 72.

Differential transconductor 52 may generate the differential current at leads 80, 82 based on the differential voltage carried by leads 60, 74 in a manner similar to that described above with respect to differential transconductor 50. For example, the difference between the components of the differential current carried by leads 80, 82 may be indicative of the difference between the components of the differential voltage carried by leads 60, 74 (a difference between a negative polarity component of input voltage signal carried by input voltage leads 58, 60 and a negative polarity component of the differential voltage carried by leads 72, 74).

Junction 88 may combine the current carried by leads 76, 80 (i.e., a positive polarity component of the differential current carried by leads 76, 78 and a positive polarity component of the differential current carried by leads 80, 82), and output the combined current via lead 84. Similarly, junction 90 may combine the current carried by leads 78, 82 (i.e., a negative polarity component of the differential current carried by leads 76, 78 and a negative polarity component of the differential current carried by leads 80, 82), and output the combined current on lead 86. In some examples, junctions 88, 90 may add the currents being combined with each other to generate an output combined current. Junctions 88, 90 may be alternatively referred to as current combiners.

Current-to-voltage converter 54 may generate a positive polarity component of the output voltage such that the component is substantially proportional to the current carried by lead 84. Similarly, current-to-voltage converter 56 may generate a negative polarity component of output voltage such that the component is substantially proportional to the current carried by lead 86. Collectively, current-to-voltage converters 54, 56 may generate a differential output voltage carried by output voltage leads 62, 64 such that a difference between the components of output voltage is substantially proportional to a difference between the components of the differential current carried by leads 84, 86.

As shown in FIG. 4, cross-point shifting circuit 12 may use multiple differential transconductors 50, 52 with their common polarity outputs coupled together to shift the cross-point of a signal. Each of transconductors 50, 52 may have a first input that is coupled to a respective input voltage lead 58, 60 and a second input that is coupled to a respective reference voltage lead 72, 74. Each of transconductors 50, 52 may generate one or more currents that have amplitudes that are determined based on a relationship (e.g., a difference) between the voltages at their respective inputs. In other words, each of the output currents of transconductors 50, 52 may have a magnitude that is determined based on the magnitude of an input voltage component carried by one of input voltage leads 58, 60 and a reference voltage carried by one of reference voltage leads 72, 74.

In cases where the difference between the input voltage component and the reference voltage received by one of transconductors 50, 52 is relatively small, the magnitude of each of the output currents of transconductors 50, 52 may be approximately equal to a difference between the input voltage component and the reference voltage. By adjusting the magnitude of the reference voltage carried by reference voltage leads 72, 74, the low-to-high and high-to-low transitions of the output current for transconductors 50, 52 may be shifted upwards or downwards relative to the low-to-high and high-to-low transitions in the input voltage carried by input voltage leads 58, 60, thereby shifting the cross-point of the signal.

In some examples, differential transconductors 50, 52 may each include a long-tailed pair of transistors. In such examples, when the difference between the input voltage component and the reference voltage received by one of transconductors 50, 52 is relatively large, then the sum of the output currents produced by one of transconductors 50, 52 may be limited by the amount of bias current in the long-tailed pair of transistors, and substantially all of the bias current may be steered to one output or the other of the transconductor depending on whether the voltage carried by one of the input voltage leads 58, 60 is greater than or less than a reference voltage carried by one of the reference voltage leads 72, 74.

The output current limiting provided by the long-tailed pairs of transistors may allow the transitions in the input voltage signal to be shifted upwards or downwards while maintaining approximately the same logic zero and logic one levels. This may allow the magnitudes of the positive and negative polarities of the resulting cross-point shifted signal to remain substantially balanced over a wide range of shifting magnitudes. Maintaining relatively balanced positive and negative polarities in the cross-point shifted signal may reduce the amount of distortion produced by subsequent stages of an optical transmitter. In this way, the quality of an optical signal generated by an optical transmitter may be improved.

The reference voltage on each of the reference voltage leads 72, 74 may be determined based on a relationship between the currents carried by leads 68, 70. Thus, by adjusting the relationship between the magnitudes of the currents carried by leads 68, 70, the amount of shifting of the low-to-high and high-to-low transitions of the output current for transconductors 50, 52 may be shifted upwards and downwards, thereby shifting the cross-point of the signal.

In some examples, the magnitudes of each of the reference voltages carried by leads 72, 74 may be determined based on a first relationship between the currents carried by leads 68, 70, and the magnitudes of each of the output currents produced by differential transconductors 50, 52 may be determined based on a second relationship between the an input voltage component carried by a respective one of the input voltage leads 58, 60 and a reference voltage carried by a respective one of the reference voltage leads 72, 74. In such examples, the first and second relationships may each be non-linear functions, but the second function may be an inverse of the first function. This may cause the relationship between the amount of shifting in the low-to-high and high-to-low transitions of the output currents produced by differential transconductors 50, 52 to be controlled in a linear manner even though the transfer functions of the individual components may be non-linear. In this way, the amount of cross-point shifting of a signal may be controlled in a relatively linear manner.

For example, differential current-to-voltage converter 48 may generate reference voltages that have a magnitude that is determined by a logarithm of a ratio of the currents carried by leads 68, 70, and each of differential transconductors 50, 52 may produce one or more output currents that have a magnitude that is determined by an exponential function of the respective reference voltages. This may allow the amount of cross-point shifting in output signal to be controlled in a relatively linear manner even though the individual transfer functions may be exponential and/or logarithmic.

Figure 5:
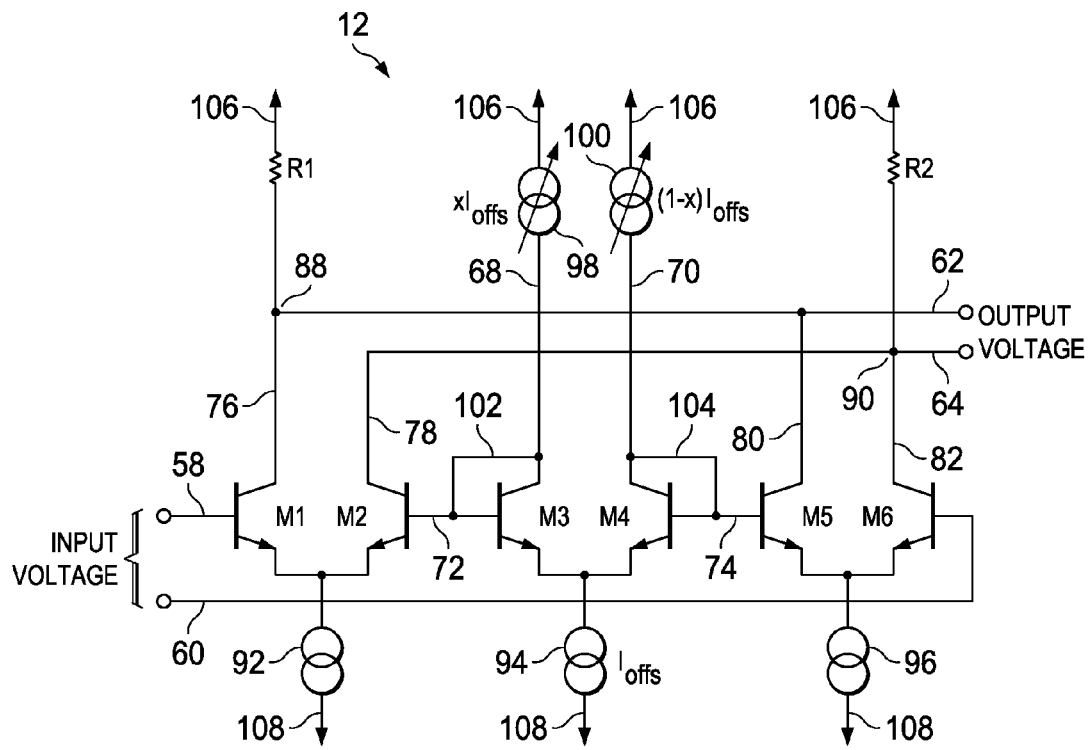
FIG. 5 is a schematic illustrating an example cross-point shifting circuit that may be used to implement the cross-point shifting circuit of FIGS. 1 and 4.

FIG. 5 is a schematic illustrating an example cross-point shifting circuit 12 that may be used to implement the cross-point shifting circuit 12 of FIGS. 1 and 4. Same or similar components between FIGS. 4 and 5 have been numbered with identical reference numerals. As shown in FIG. 5, cross-point shifting circuit 12 includes transistors M1, M2, M3, M4, M5, M6, current sources 92, 94, 96, adjustable current sources 98, 100, resistances R1, R2, leads 102, 104, a high power supply rail 106, and a low power supply rail 108.

In the example cross-point shifting circuit 12 of FIG. 5, transistors M1, M2, M3, M4, M5, M6 are NPN bipolar junction transistors (BJTs). However, in other examples, transistors M1, M2, M3, M4, M5, M6 may be other types of transistors and/or other polarities of transistors.

A power supply terminal of adjustable current source 98 is coupled to high power supply rail 106. An output terminal of adjustable current source 98 is coupled to a collector of transistor M3 via lead 68. A power supply terminal of adjustable current source 100 is coupled to high power supply rail 106. An output terminal of adjustable current source 100 is coupled to a collector of transistor M4 via lead 70.

The collector of transistor M3 is coupled to a base of transistor M3 via lead 102. The collector of transistor M4 is coupled to the base of transistor M4 via lead 104. The base and collector of transistor M3 are coupled to the base of transistor M2 via lead 72. The base and collector of transistor M4 are coupled to the base of transistor M5 via lead 74. The emitters of transistors M3, M4 are coupled to each other. An output terminal of current source 94 is coupled to the emitters of transistors M3, M4, and a power supply terminal of current source 94 is coupled to low power supply rail 108.

The base of transistor M1 is coupled to input voltage lead 58. The collector of transistor M1 is coupled to junction 88 via lead 76. The collector of transistor M2 is coupled to junction 90 via lead 78. The emitters of transistors M1, M2 are coupled to each other. An output terminal of current source 92 is coupled to the emitters of transistors M1, M2, and a power supply terminal of current source 92 is coupled to low power supply rail 108.

The base of transistor M6 is coupled to input voltage lead 60. The collector of transistor M5 is coupled to junction 88 via lead 80. The collector of transistor M6 is coupled to junction 90 via lead 82. The emitters of transistors M5, M6 are coupled to each other. An output terminal of current source 96 is coupled to the emitters of transistors M5, M6, and a power supply terminal of current source 96 is coupled to low power supply rail 108.

Resistance R1 is coupled between junction 88 and high power supply rail 106. Resistance R2 is coupled between junction 90 and high power supply rail 106. Junction 88 is coupled to output voltage lead 62, and junction 90 is coupled to output voltage lead 64.

Adjustable current sources 98, 100 may form a differential current source corresponding to differential current source 46 in FIG. 4. Each of adjustable current sources 98, 100 may have a control input that is coupled to circuitry that controls adjustable current sources 98, 100. The circuitry that controls adjustable current sources 98, 100 may be coupled to offset control lead 66 (FIG. 4) and control adjustable current sources 98, 100 based on an offset control signal. In the example cross-point shifting circuit 12 illustrated in FIG. 5, the offset control signal may correspond to the x variable, and the control circuitry may cause adjustable current source 98 to output a current having a level of $x*I_{offs}$, and cause adjustable current source 100 to output a current having a level of $(1-x)*I_{offs}$. The difference between these two currents may form a differential current signal with a differential magnitude of $(2x-1)*I_{offs}$. The common mode subcomponent of each of the currents produced by adjustable current sources 98, 100 may be equal to $I_{offs}/2$.

Transistors M3, M4, current source 94 and leads 102, 104 may form a long-tailed pair, which may be alternatively referred to as a differential transconductor. The feedback from the collectors to the bases of transistors M3, M4 provided by leads 102, 104 may allow the differential transconductor to operate as a differential current-to-voltage converter corresponding to differential current-to-voltage converter 48 in FIG. 4.

Transistors M1, M2 and current source 92 may form a long-tailed pair or differential transconductor corresponding to differential transconductor 50 in FIG. 4. Similarly, transistors M5, M6 and current source 96 may form another long-tailed pair or differential transconductor corresponding to differential transconductor 52 in FIG. 4.

Resistances R1, R2 may each form a current-to-voltage converter corresponding, respectively, to current-to-voltage converters 54, 56 in FIG. 4. For each of resistances R1, R2, the input current and output voltage are applied to and taken from the same terminal of the respective resistance.

During operation, the differential current source formed by adjustable current sources 98, 100 outputs a differential current on leads 68, 70 with a differential component that is based on an offset control signal. The differential component of the differential current may correspond to $(2x-1)*I_{offs}$. The differential current may also have a common mode component corresponding to $I_{offs}/2$. In some examples, current source 94 may be used to adjust the common mode component of the differential signal.

The differential current-to-voltage converter formed by transistors M3, M4, current source 94, and leads 102, 104 may convert the differential current carried by leads 68, 70 to a differential voltage carried by leads 72, 74. The differential transconductor formed by transistors M1, M2 and current source 92 may convert a difference between a voltage carried by input voltage lead 58 and a voltage carried by lead 72 to a differential current, and output the differential current via leads 76, 78. The differential transconductor formed by transistors M3, M4 and current source 96 may convert a difference between a voltage carried by lead 74 and a voltage carried by input voltage lead 60 to a differential current, and output the differential current via leads 80, 82.

Junction 88 may combine the currents carried by leads 76, 80, and supply the combined current to resistance R1. Junction 90 may combine the currents carried by leads 78, 82, and supply the combined current to resistance R2. Resistance R1 may convert the combined current supplied by junction 88 to a voltage and output the voltage at output voltage lead 62. Resistance R2 may convert the combined current supplied by junction 90 to a voltage and output the voltage at output voltage lead 64. Collectively, resistances R1, R2 may convert the differential current supplied by junctions 88, 90 to a differential voltage, and output the differential voltage via output voltage leads 62, 64.

As shown in FIG. 5, cross-point shifting circuit 12 uses multiple long-tailed pairs of transistors to form multiple differential transconductors with their common polarity outputs coupled together to shift the cross-point of a signal. In cases where the difference between the input voltage component and the reference voltage received by one of the long-tailed pairs of transistors is relatively small, the magnitude of each of the output currents of the long-tailed pair of transistors may have a magnitude that is approximately equal to a difference between the input voltage component and the reference voltage. By adjusting the magnitude of the reference voltage carried by reference voltage leads 72, 74, the low-to-high and high-to-low transitions of the output current for the long-tailed pair of transistors may be shifted upwards or downwards relative to the low-to-high and high-to-low transitions in the input voltage carried by input voltage leads 58, 60, thereby shifting the cross-point of the resulting output signal.

When the difference between the input voltage component and the reference voltage received by one of the long-tailed pairs of transistors is relatively large, then the sum of the output currents produced by one of the long-tailed pairs of transistors may be limited by the amount of bias current provided to the long-tailed pair of transistors, and substantially all of the bias current may be steered to one output or the other of the long-tailed pair of transistors depending on whether the voltage carried by one of the input voltage leads 58, 60 is greater than or less than a reference voltage carried by one of the reference voltage leads 72, 74.

The output current limiting provided by the long-tailed pairs of transistors may allow the transitions in the input voltage signal to be shifted upwards or downwards while maintaining approximately the same (i.e., approximately constant) logic zero and logic one levels. This may allow the magnitudes of the positive and negative polarities of the resulting cross-point shifted signal to remain substantially balanced over a wide range of shifting magnitudes. Maintaining relatively balanced positive and negative polarities may reduce the amount of distortion produced by subsequent stages of an optical transmitter. In this way, the quality of an optical signal generated by an optical transmitter may be improved.

The reference voltage carried by each of the reference voltage leads 72, 74 may be determined based on a relationship between the currents carried by leads 68, 70. Thus, by adjusting the relationship between the magnitudes of the currents carried by leads 68, 70, the amount of shifting of the low-to-high and high-to-low transitions of the output current for the long-tailed pairs of transistors may be shifted upwards and downwards, thereby shifting the cross-point of the signal.

The magnitudes of each of the reference voltages carried by leads 72, 74 may be determined based on a logarithm of a ratio of the currents carried by leads 68, 70, and the magnitudes of each of the output currents produced by differential the long-tailed pair of transistors may be determined based on an exponential function of the respective reference voltage. Because the transfer functions are inversely related, the amount of shifting in the low-to-high and high-to-low transitions of the output currents produced by differential the long-tailed pair of transistors may be be controlled in a relatively linear manner even though the individual transfer functions may be non-linear. In this way, the amount of cross-point shifting of a signal may be controlled in a relatively linear manner.

Figure 6:
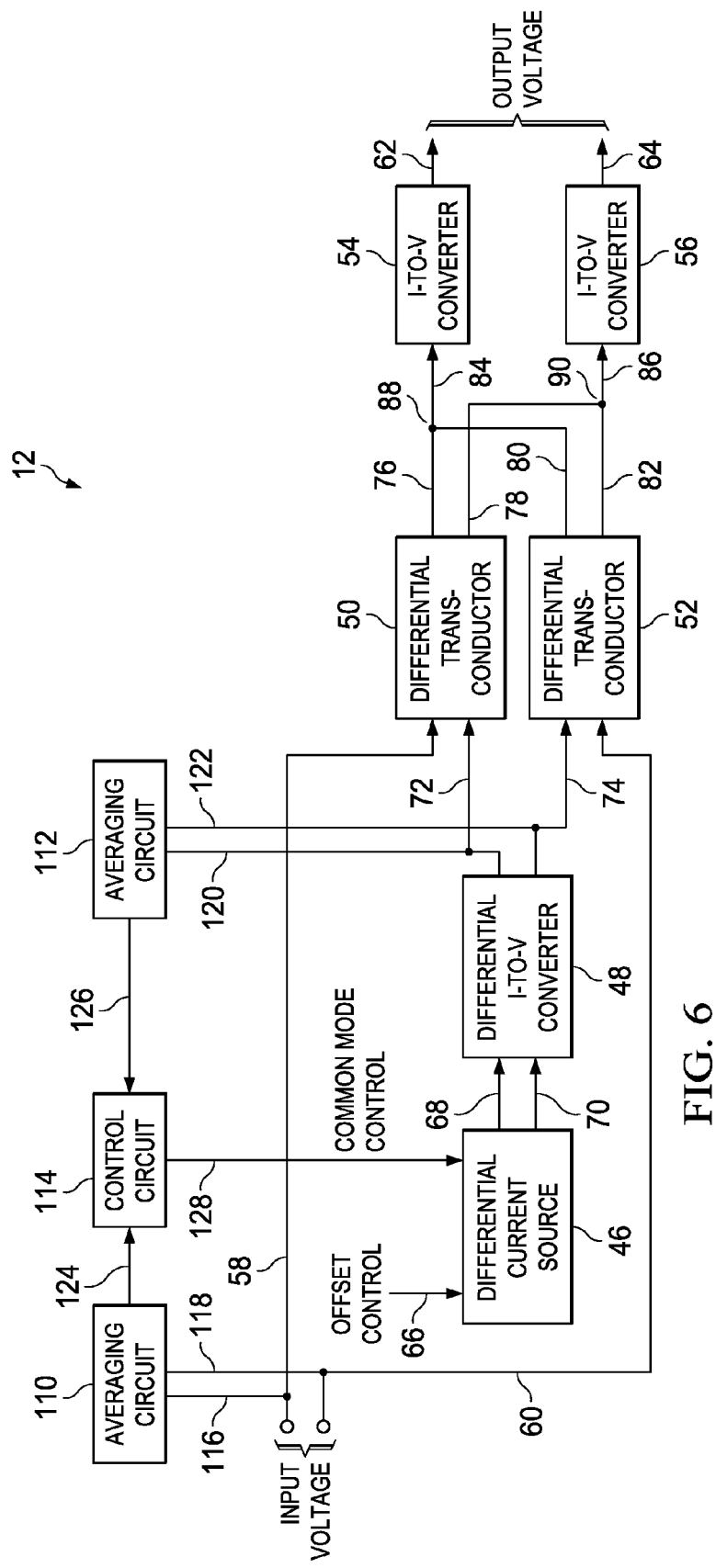
FIG. 6 is a block diagram illustrating the example cross-point shifting circuit of FIGS. 1 and 4 with common mode voltage correction circuitry according to this disclosure.

FIG. 6 is a block diagram illustrating the example cross-point shifting circuit 12 of FIGS. 1 and 4 with added common mode voltage correction circuitry according to this disclosure. As shown in FIG. 6, the common mode voltage correction circuitry includes averaging circuits 110, 112, control circuit 114, and leads 116, 118, 120, 122, 124, 126, 128.

A positive polarity input of averaging circuit 110 is coupled to input voltage lead 58 via lead 116. A negative polarity input of averaging circuit 110 is coupled to input voltage lead 60 via lead 118. A positive polarity input of averaging circuit 112 is coupled to lead 72 via lead 120. A negative polarity input of averaging circuit 112 is coupled to lead 74 via lead 122. An output of averaging circuit 110 is coupled to a first input of control circuit 114 via lead 124. An output of averaging circuit 112 is coupled to a second input of control circuit 114 via lead 126. An output of control circuit 114 is coupled to a common mode control input of differential current source 46.

During operation, averaging circuit 110 receives a differential input voltage signal via leads 116, 118, generates a first average signal based on the differential input signal, and outputs the first average signal at lead 124. Averaging circuit 112 receives a differential voltage via leads 120, 122, generates a second average signal based on the differential voltage, and outputs the second average signal via lead 126. Control circuit 114 generates a common mode control signal based on the first average signal supplied by averaging circuit 110 and the second average signal supplied by averaging circuit 112, and outputs the common mode control signal via lead 128. Differential current source 46 control the common mode component of the differential current at leads 68, 70 based on the common mode control signal.

The first average signal may be indicative of the common mode voltage of the differential input voltage signal carried by leads 58, 60, and the second average signal may be indicative of the common mode voltage of the differential voltage carried by leads 72, 74. In some examples, control circuit 114 may control differential current source 46 via the common mode control signal such that the common mode voltage of the differential input voltage signal carried by leads 58, 60 is approximately equal to the common mode voltage of the differential voltage carried by leads 72, 74. In such examples, control circuit 114 may control differential current source 46 to minimize the difference between the first average signal and the second average signal. Equalizing the common mode voltages in the above-described manner may improve the performance of cross-point shifting circuit 12 and/or ensure proper operation of cross-point shifting circuit 12.

Figure 7:
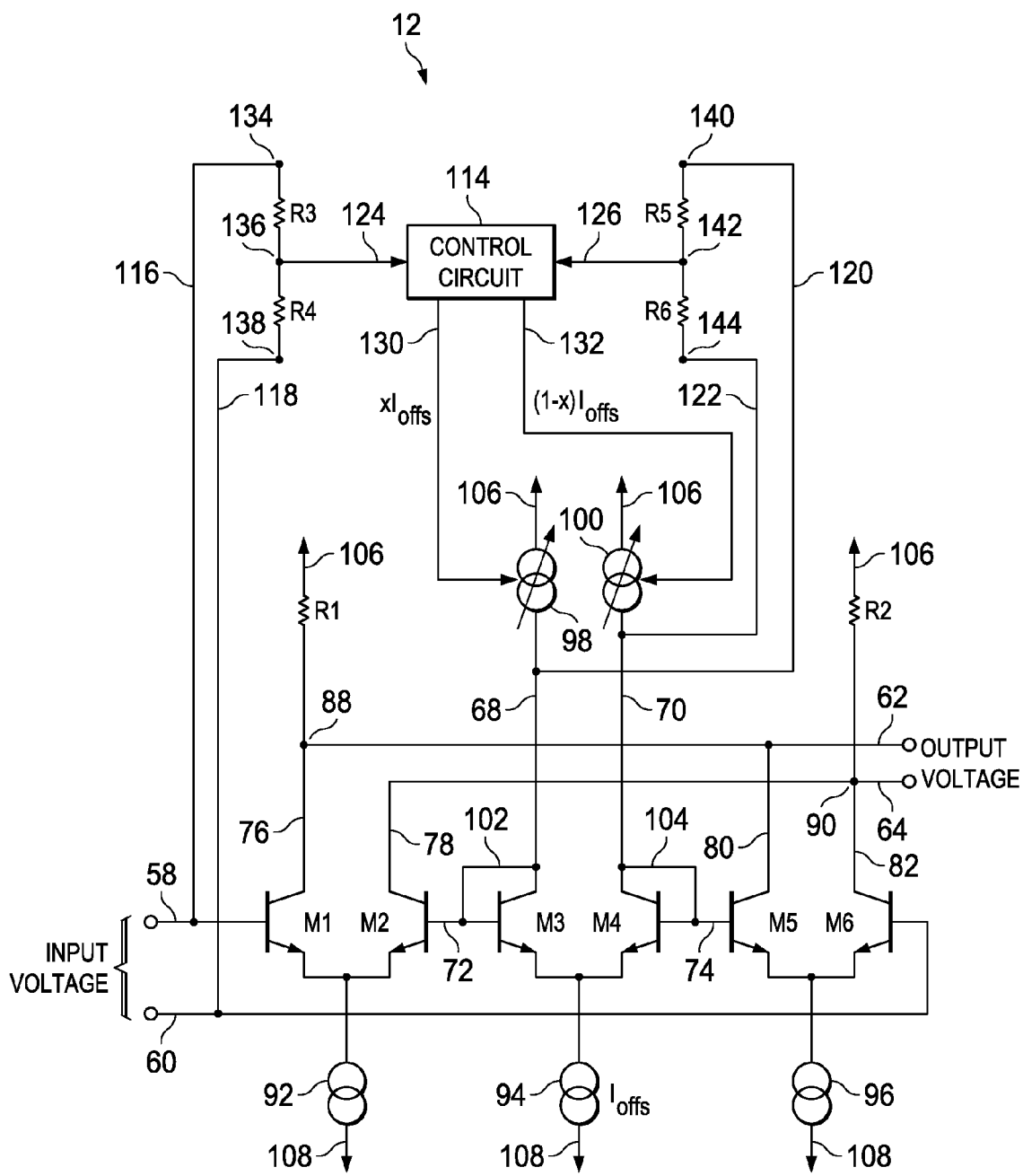
FIG. 7 is a schematic illustrating an example cross-point shifting circuit that may be used to implement the cross-point shifting circuit of FIG. 6.

FIG. 7 is a schematic illustrating an example cross-point shifting circuit 12 that may be used to implement the cross-point shifting circuit of FIG. 6. The cross-point shifting circuit 12 in FIG. 7 is similar to the cross-point shifting circuit 12 shown in FIG. 5 except that common mode voltage correction circuitry has been added. Same or similar components between FIGS. 5-7 have been numbered with identical reference numerals. The common mode circuitry includes resistances R3, R4, R5, R6, control circuit 114, leads 116, 118, 120, 122, 124, 126, 130, 132, and nodes 134, 136, 138, 140, 142, 144.

Node 134 is coupled to input voltage lead 58 via lead 116. Node 136 is coupled to input voltage lead 60 via lead 118. Resistance R3 is coupled between node 134 and node 136. Resistance R4 is coupled between node 136 and node 138. Node 136 is coupled to a first input of control circuit 114 via lead 124.

Node 140 is coupled to lead 72 via leads 68, 102, 120. Node 144 is coupled to lead 74 via leads 70, 104, 122. Resistance R5 is coupled between node 140 and node 142. Resistance R6 is coupled between node 142 and node 144. Node 142 is coupled to control circuit 114 via lead 126.

A first output of control circuit 114 is couple to adjustable current source 98 via lead 130. A second output of control circuit 114 is coupled to adjustable current source 100 via lead 132.

Resistances R3, R4 may form a first averaging circuit that generates a first average signal at lead 124. The first average signal may be indicative of the common mode voltage of the differential input signal carried by leads 58, 60. Resistances R3, R4 may form a second averaging circuit that generates a second average signal at lead 126. The second average signal may be indicative of the common mode voltage of the differential voltage carried by leads 72, 74. Control circuit 114 may control adjustable current source 98 via lead 130 and control adjustable current source 100 via lead 132 so as to cause the common mode voltages between the differential input signal carried by leads 58, 60 and the differential voltage carried by leads 72, 74 to be substantially equal. In some cases, leads 130, 132 may be used to adjust $I_{offs}$, but maintain the same ratio of $x*I_{offs}$ to $(1-x)*I_{offs}$. In some cases, an additional lead may extend from control circuit 114 to current source 94 to adjust $I_{offs}$ produced by current source 94.

During operation, control circuit 114 may control the common mode currents produced by adjustable current sources 98, 100 so as to cause the common mode voltage of the differential input signal carried by leads 58, 60 to be substantially equal to the common mode voltage of the differential voltage carried by leads 72, 74. When the common mode voltages are equal, transistors M2, M3, M4, M5 may form a virtual two-quadrant multiplier and/or a virtual translinear circuit. As such, transistors M2, M3, M4, M5 may regulate the collector currents of transistors M2, M3, M4, M5 such that ratio of the collector current of transistor M3 to the collector current of transistor M4 is substantially equal to the ratio of the collector current collector current of transistor M2 to the collector current of transistor M5. This may allow the amount of cross-point shifting to be controlled in a relatively linear manner even though non-linear devices may be used.

Figure 8:
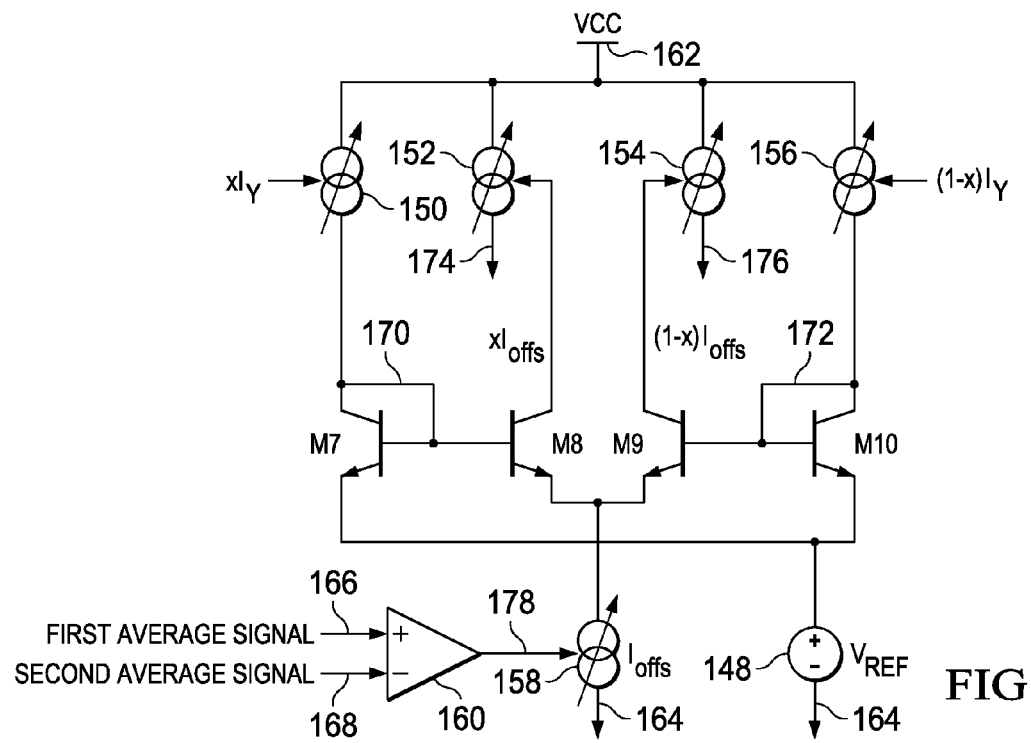
FIG. 8 is a schematic illustrating an example control circuit according to this disclosure.

FIG. 8 is a schematic illustrating an example control circuit 114 according to this disclosure. Control circuit 114 includes transistors M7, M8, M9, M10, a reference voltage source 148, adjustable current sources 150, 152, 154, 156, 158, an operational amplifier 160, a high voltage rail 162, a low voltage rail 164 and leads 166, 168, 170, 172, 174, 176, 178. It should be noted that adjustable current sources 152, 154 may be a part of differential current source 46 shown in FIG. 4 and may correspond to adjustable current sources 98, 100, respectively, in FIGS. 5 and 7.

In the example control circuit 114 of FIG. 8, transistors M7, M8, M9, M10 are NPN bipolar junction transistors (BJTs). However, in other examples, transistors M7, M8, M9, M10 may be other types of transistors and/or other polarities of transistors.

A positive polarity input of operational amplifier 160 is coupled to first average signal lead 166. A negative polarity input of operational amplifier 160 is coupled to second average signal lead 168. An output of operational amplifier 160 is coupled to a control input of adjustable current source 158 via lead 178. Low voltage rail 164 is coupled to a power supply input of adjustable current source 158 and to a first terminal of reference voltage source 148. An output of adjustable current source 158 is coupled to the emitters of transistors M8, M9. The emitters of transistors M8, M9 are coupled to each other. A second terminal of reference voltage source 148 is coupled to the emitters of transistors M7, M10. The emitters of transistors M7, M10 are coupled to each other. The collector of transistor M7 is coupled to the base of transistor M7 via lead 170. The collector of transistor M10 is coupled to the base of transistor M10 via lead 172. The collector and base of transistor M7 are coupled to the base of transistor M8. The collector and base of transistor M10 are coupled to the base of transistor M9. The collector of transistor M7 is coupled to an output of adjustable current source 150. The collector of transistor M10 is coupled to the output of adjustable current source 156. The collector of transistor M8 is coupled to a control input of adjustable current source 152. The collector of transistor M9 is coupled to a control input of adjustable current source 154. The power supply inputs of adjustable current sources 150, 152, 154, 156 are coupled to high voltage rail 162.

Transistors M7, M8, M9, M10 may form a two-quadrant analog multiplier. As such, transistors M7, M8, M9, M10 may regulate the collector currents of transistors M7, M8, M9, M10 such that the product of the collector currents produced by transistors M7 and M9 is substantially equal to the product of the collector currents produced by transistors M8 and M10.

During operation, control circuit 114 may control adjustable current sources 150, 156 to output two currents having a target ratio. For example, control circuit 114 may control adjustable current source 150 to output a current level of $x*I_Y$, and control adjustable current source 156 to output a current level of $(1-x)*I_Y$. The analog multiplier formed by transistors M7, M8, M9, M10 receives the currents produced by adjustable current sources 150, 156 at the collectors of transistors M7, M10, and generates currents at the collectors of transistors M8, M9 such that the ratio of the currents at the collectors of transistors M8, M9 is substantially equal to the ratio of the currents at the collectors of transistors M7, M10. For example, the ratio of the current at the collector of transistor M7 to the current at the collector of transistor M10 may be substantially equal to the ratio of the current at the collector of transistor M8 to the current at the collector of transistor M9.

Adjustable current source 152 may output a current having a current level that is determined based on the current output by the collector of transistor M8. Adjustable current source 154 may output a current having a current level that is determined based on the current output by the collector of transistor M9. In some examples, adjustable current sources 152 and 154 may be current-controlled current sources, such as, e.g., current mirrors.

The analog multiplier formed by transistors M7, M8, M9, M10 may also scale the currents received via transistors M7, M10 by a scaling factor that is determined by the amount of current produced by adjustable current source 158. For example, the sum of the currents produced by adjustable current source 158 may be equal to $I_{offs}$ whereas the sum of the currents received by transistors M7, M10 may be equal to $I_Y$.

Operational amplifier 160 may output a signal at lead 178 that is indicative of the difference between the first and second average signals carried by first and second average signal leads 166, 168. Adjustable current source 158 may adjust the total amount of current output by adjustable current source 158 (i.e., $I_{offs}$) based on the signal produced by operational amplifier 160 (i.e., based on the difference between the first and second average signals). Collectively, control circuit 114 may regulate the common mode component of the currents output by adjustable current sources 152 and 154 such that the common mode voltages of the differential input signal carried by leads 58, 60 (FIG. 7) and the differential voltage carried by leads 72, 74 (FIG. 7) are approximately equal.

Figure 9:
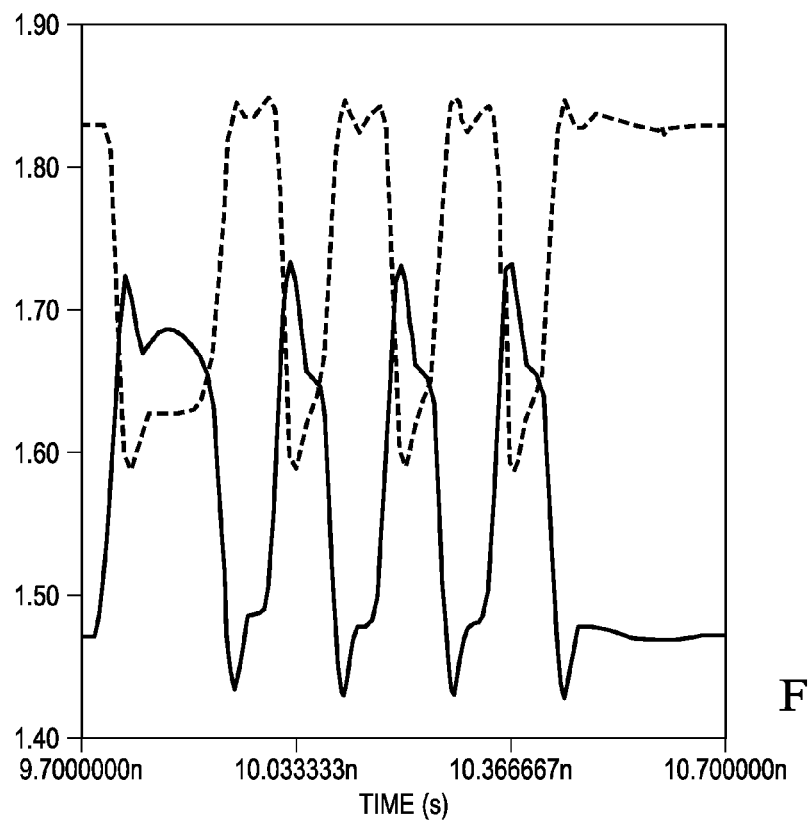
FIGS. 9-12 are diagrams illustrating and comparing example performance characteristics of various cross-point shifting circuits according to this disclosure.
Figure 10:
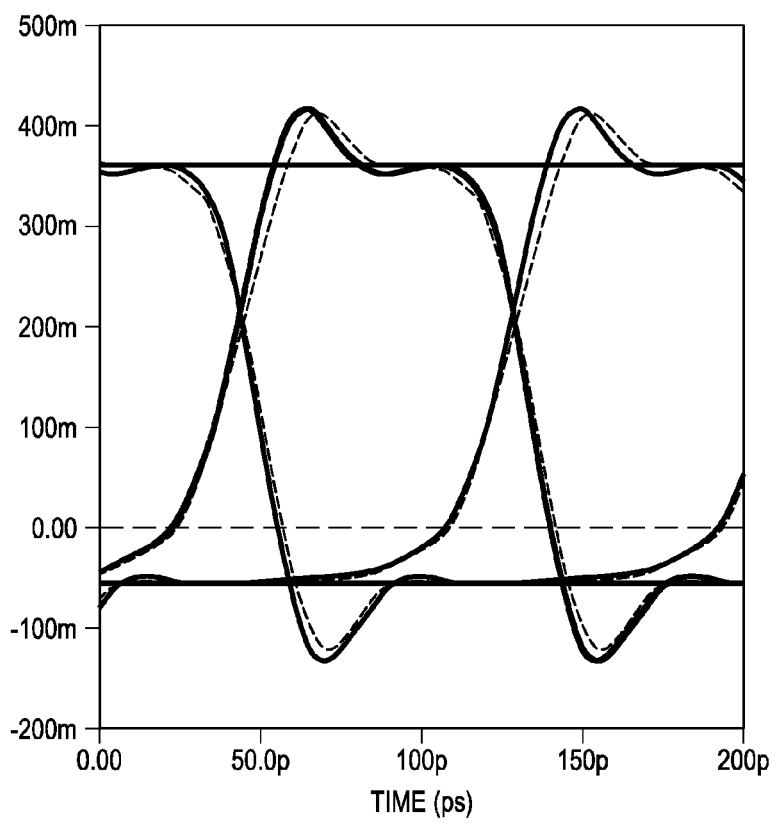
Figure 11:
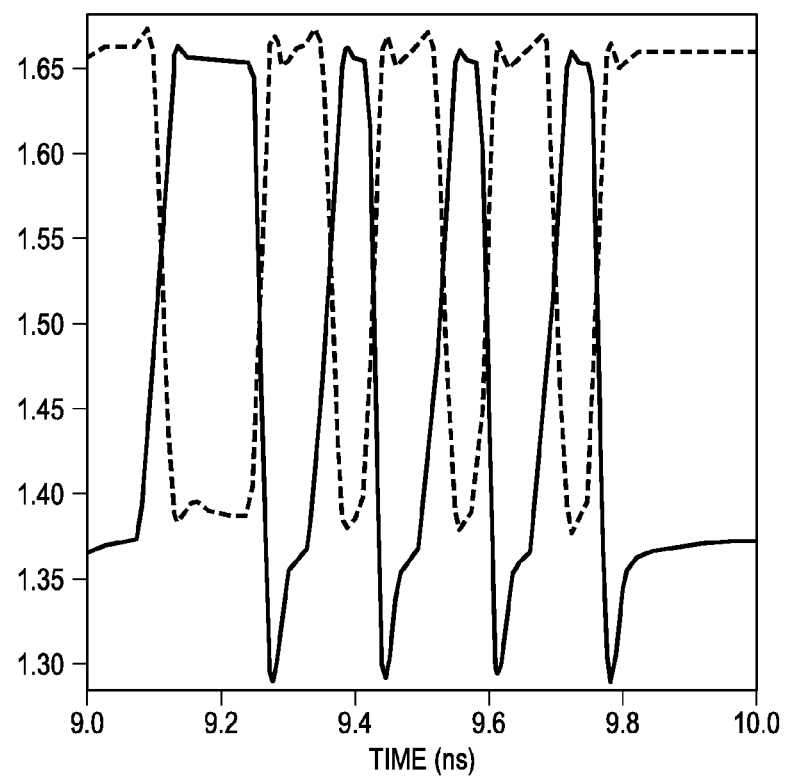
Figure 12:
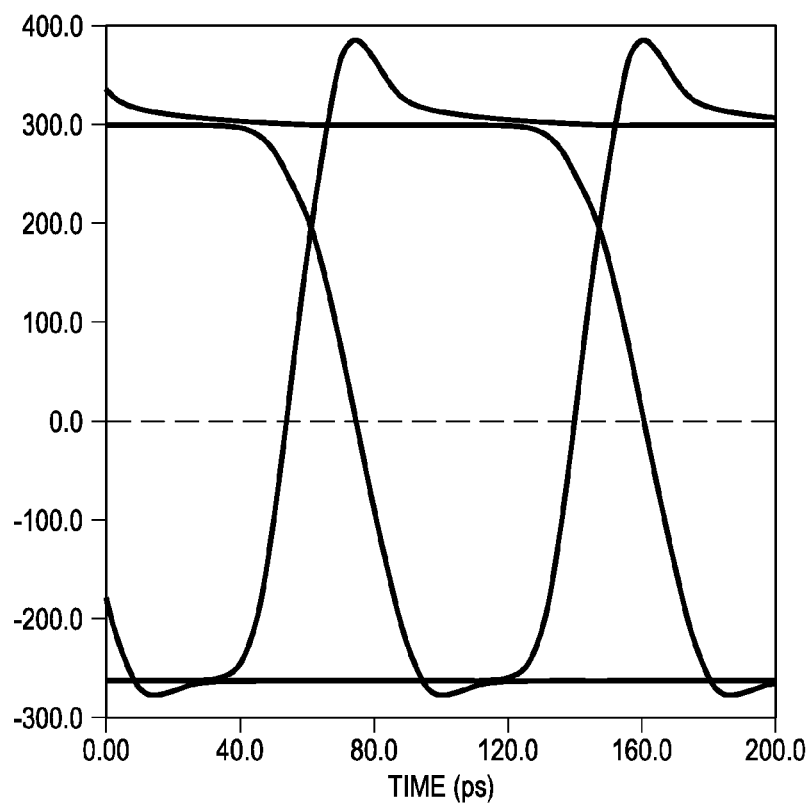

FIGS. 9-12 are diagrams illustrating and comparing example performance characteristics of various cross-point shifting circuits according to this disclosure. FIGS. 9 and 10 illustrate output characteristics of a cross-point circuit that feeds a current into a load or degeneration resistor to generate an offset voltage, and runs the signal with the superimposed offset through a limiting stage to transform the offset voltage into a pulse-width-distortion yielding a cross-point shift. FIGS. 11 and 12 illustrate output characteristics of a cross-point circuit designed according to the techniques of this disclosure. FIGS. 9 and 11 illustrate the single-ended output signals of their corresponding cross-point shifting circuits, and FIGS. 10 and 12 illustrate differential output signals for their corresponding cross-point shifting circuits.

As shown in FIGS. 9 and 10, other techniques of cross-point shifting may lead to relatively high amounts of signal distortion being introduced by unbalanced common mode biasing and excessive offset voltages preventing succeeding stages from proper switching. This may yield reduced single-sided, unbalanced output amplitudes and, in some cases, loss of functionality when the offset surpasses the input voltage required for switching the succeeding stage.

As shown in FIGS. 11 and 12, the techniques of this disclosure may increase the balance between the positive and negative polarities of the resulting cross-point shifted signal relative to other types of cross-point shifting techniques. Increasing the degree of polarity balance in the cross-point shifted signal may reduce the amount of distortion produced by subsequent stages of an optical transmitter. In this way, the quality of an optical signal generated by an optical transmitter may be improved.

In addition, the techniques of this disclosure may, in some examples, superimpose the offset in a current mode manner without converting the controlling current into an offset voltage. Temperature independency may, in some examples, be achieved by additional biasing. The cross-point shifting techniques of this disclosure may, in some examples, not require an additional limiting stage and may, in some cases, prevent the overdriving of the circuit and loss of switching functionality that may be caused by excessive superimposed offsets. In this way, the techniques of this disclosure may reduce the distortion penalty associated with shifting the cross-points of signals.

Figure 13:
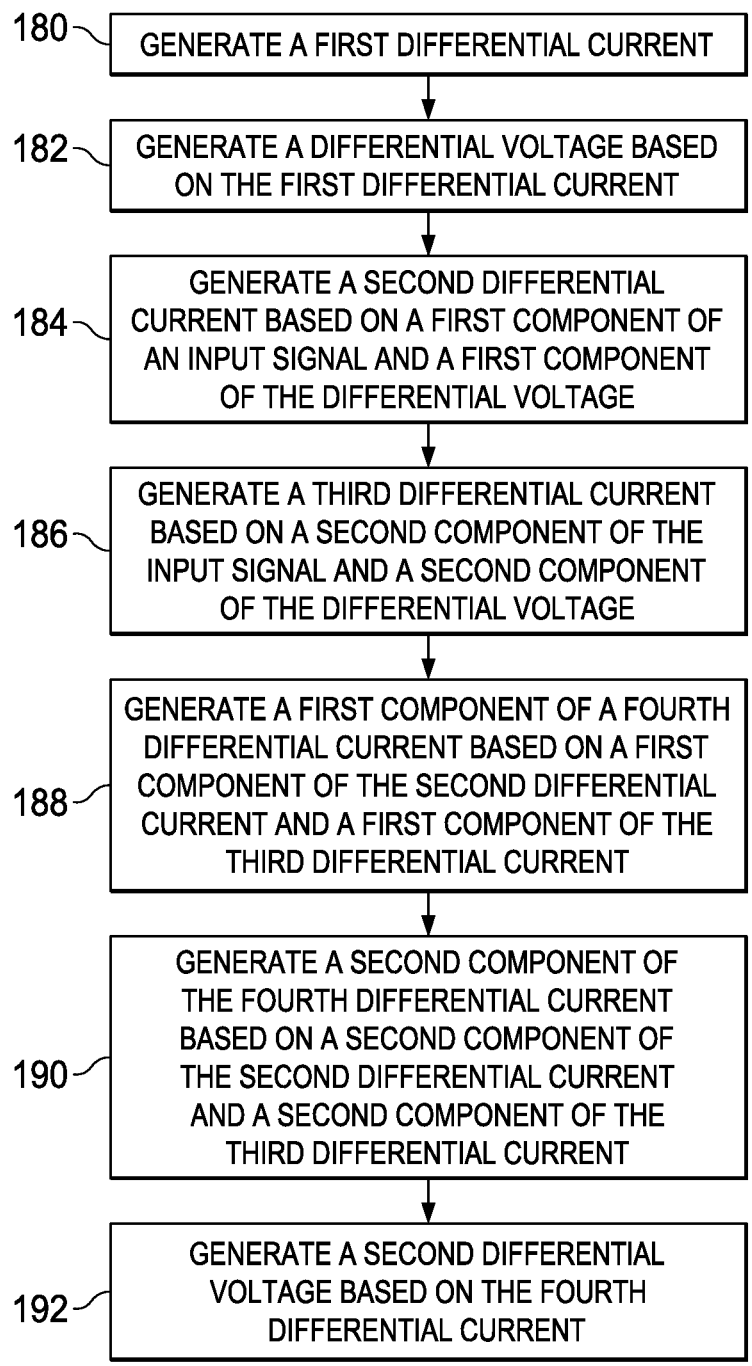
FIG. 13 is a flow diagram illustrating an example technique for shifting the cross-point of a digital signal according to this disclosure.

FIG. 13 is a flow diagram illustrating an example technique for shifting the cross-point of a digital signal according to this disclosure. The technique illustrated in FIG. 13 may be performed by any of the cross-point shifting circuits 12 described in this disclosure. However, for exemplary purposes, the technique will be described with respect to the cross-point shifting circuit 12 shown in FIG. 6.

Differential current source 46 generates a first differential current (180). In some examples, differential current source 46 may generate the first differential current based on a target amount of cross-point shifting for the input signal. For example, differential current source 46 may generate the first differential component such that a difference between two components of the first differential current is a function of the target amount of cross-point shifting.

Differential current-to-voltage converter 48 generates a differential voltage based on the first differential current (182). In some examples, the differential voltage is indicative of a difference between two components of the differential current.

Differential transconductor 50 generates a second differential current based on a first component of an input signal and a first component of the differential voltage (184). Differential transconductor 52 generates a third differential current based on a second component of the input signal and a second component of the differential voltage (186). In some examples, the second differential current is indicative of a difference between the first component of the input signal and the first component of the differential voltage, and the third differential current is indicative of a difference between the second component of the differential voltage and the second component of the input signal. In further examples, a difference between two components of the second differential signal is substantially proportional to the difference between the first component of the input signal and the first component of the differential voltage, and a difference between two components of the third differential signal is substantially proportional to the difference between the second component of the differential voltage and the second component of the input signal.

Junction 88 generates a first component of a fourth differential current based on a first component of the second differential current and a first component of the third differential current (188). Junction 90 generates a second component of the fourth differential current based on a second component of the second differential current and a second component of the third differential current (190). In some examples, junction 88 may combine the first component of the second differential current and the first component of the third differential current to generate the first component of the fourth signal, and junction 90 may combine the second component of the second differential current and the second component of the third differential current to generate the second component of the fourth signal. In further examples, to perform the combination, junction 88 may add the first component of the second differential current to the first component of the third differential current to generate the first component of the fourth signal, and junction 90 may add the second component of the second differential current to the second component of the third differential current to generate the second component of the fourth signal.

Current-to-voltage converters 54, 56 generate a second differential voltage based on the fourth differential current (192). In some examples, current-to-voltage converters 54, 56 may generate the second differential voltage such that a difference between two components of the second differential voltage is substantially proportional to a difference between two components of the fourth differential current.

In some examples, averaging circuit 110 may generate a first average signal indicative of a common mode voltage of the input signal, averaging circuit 112 may generate a second average signal indicative of a common mode voltage of the differential voltage signal, and control circuit 114 may control a common mode component of the first differential current based on the first and second average signals.

In additional examples, control circuit 114 may control the common mode component of the first differential current so as to cause the common mode voltage of the input signal to be substantially equal to the common mode of the differential voltage signal.

In some examples, the input signal is indicative of data to be optically transmitted, and the fourth signal is an electrical signal, and electrical-to-optical converter 16 may convert the fourth signal to an optical signal.

In some examples, an integrated circuit (e.g., FIGS. 4 and 6) includes a differential current source 46 having a differential current output (e.g., the positive and negative polarity outputs of differential current source 46). The integrated circuit further includes a differential current-to-voltage converter 48 having a differential input coupled to the differential current output of the differential current source, and a differential voltage output (e.g., the positive and negative polarity outputs of differential current-to-voltage converter 48). The integrated circuit further includes a first differential transconductor 50 having a first input coupled to a first input voltage component lead (e.g., input voltage lead 58), a second input coupled to a first terminal of the differential voltage output (e.g., the positive polarity output of differential current-to-voltage converter 48), and a differential current output (e.g. the positive and negative polarity outputs of differential transconductor 50). The integrated circuit further includes a second differential transconductor 52 having a first input coupled to a second terminal of the differential voltage output (e.g., the negative polarity output of differential current-to-voltage converter 48), a second input coupled to a second input voltage component lead (e.g., input voltage lead 60), and a differential current output (e.g. the positive and negative polarity outputs of differential transconductor 52).

A first terminal of the differential current output of the first differential transconductor 50 (e.g., the positive polarity output of differential transconductor 50) is coupled to a first terminal of the differential current output of the second differential transconductor 52 (e.g., the positive polarity output of differential transconductor 52). A second terminal of the differential current output of the first differential transconductor 50 (e.g., the negative polarity output of differential transconductor 50) is coupled to a second terminal of the differential current output of the second differential transconductor 52 (e.g., the negative polarity output of differential transconductor 52).

In some examples, differential current source 46 is configured to output a differential current at the differential current output, differential current-to-voltage converter 48 is configured to generate a differential voltage based on the first differential current, and outputs the differential voltage at the differential voltage output. In such examples, the first differential transconductor 50 is configured to generate a second differential current based on a first component of an input signal and a first component of the differential voltage, and output the second differential current at the differential current output of the first differential transconductor 50. In such examples, the second differential transconductor 52 is configured to generate a third differential current based on a second component of the input signal and a second component of the differential voltage, and output the third differential current at the differential current output of the second differential transconductor 52.

In further examples, the integrated circuit further includes a first current combiner (e.g., junction 88) configured to generate a first component of a fourth differential current based on a first component of the second differential current and a first component of the third differential current, and a second current combiner (e.g., junction 90) configured to generate a second component of the fourth differential current based on a second component of the second differential current and a second component of the third differential current.

In additional examples, the integrated circuit (e.g., FIGS. 5 and 7) includes a power rail (e.g., high power supply rail 106), a first resistance R1 coupled between the power rail and the first terminal of the differential current output of the first differential transconductor (e.g., the collector of transistor M1), a second resistance coupled between the power rail and the second terminal of the differential current output of the first differential transconductor (e.g., the collector of transistor M2).

In some examples, the integrated circuit (e.g., FIGS. 6 and 7) includes a first averaging circuit 110 having a first input coupled to the first input voltage component lead, a second input coupled to the second input voltage component lead, and an output. In such examples, the integrated circuit further includes a second averaging circuit 112 having a first input coupled to the first terminal of the differential voltage output, a second input coupled to the second terminal of the differential voltage output, and an output. In such examples, the integrated circuit further includes a control circuit 114 having a first input coupled to the output of the first averaging circuit, a second input coupled to the output of the second averaging circuit, and an output coupled to an input of the differential current source.

In some examples, the first averaging circuit 110 is configured to generate a first average signal indicative of a common mode voltage of an input signal carried by the first and second input voltage component leads, the second averaging circuit 112 is configured to generate a second average signal indicative of a common mode voltage of the differential voltage signal produced by the differential current-to-voltage converter, and the control circuit 114 is configured to control a common mode component of a differential current produced by the differential current source based on the first and second average signals. In further examples, the control circuit 114 is configured to control the common mode component of the differential current so as to cause the common mode voltage of the input signal to be substantially equal to the common mode voltage of the differential voltage signal.

In further examples, the integrated circuit further includes a first current-to-voltage converter 54 having an input coupled to the first terminal of the differential current output of the first differential transconductor. In such examples, the integrated circuit further includes a second current-to-voltage converter 56 having an input coupled to the second terminal of the differential current output of the second differential transconductor.

In some examples, the integrated circuit further includes a data generator coupled to the first and second input voltage component leads, a driver circuit 14 coupled to the outputs of the first and second transconductors, and an electrical-to-optical converter 16 coupled to the driver circuit.

The techniques and circuitry described in this disclosure may, in some examples, be implemented on any combination of one or more integrated circuits or other devices. Although illustrative examples have been shown and described by way of example, a wide range of alternative examples are possible within the scope of the foregoing disclosure.

What is claimed is:

1. An integrated circuit comprising:
   a differential current source having a differential current output;
   a differential current-to-voltage converter having a differential input coupled to the differential current output of the differential current source, and a differential voltage output;
   a first differential transconductor having a first input coupled to a first input voltage component lead, a second input coupled to a first terminal of the differential voltage output, and a differential current output; and
   a second differential transconductor having a first input coupled to a second terminal of the differential voltage output, a second input coupled to a second input voltage component lead, and a differential current output,
   wherein a first terminal of the differential current output of the first differential transconductor is coupled to a first terminal of the differential current output of the second differential transconductor, and
   wherein a second terminal of the differential current output of the first differential transconductor is coupled to a second terminal of the differential current output of the second differential transconductor.

2. The integrated circuit of claim 1,
   wherein the differential current source is configured to output a first differential current at the differential current output,
   wherein the differential current-to-voltage converter is configured to generate a differential voltage based on the first differential current, and output the differential voltage at the differential voltage output,
   wherein the first differential transconductor is configured to generate a second differential current based on a first component of an input signal and a first component of the differential voltage, and output the second differential current at the differential current output of the first differential transconductor, and
   wherein the second differential transconductor is configured to generate a third differential current based on a second component of the input signal and a second component of the differential voltage, and output the third differential current at the differential current output of the second differential transconductor.

3. The integrated circuit of claim 2, further comprising:
   a first current combiner configured to generate a first component of a fourth differential current based on a first component of the second differential current and a first component of the third differential current; and
   a second current combiner configured to generate a second component of the fourth differential current based on a second component of the second differential current and a second component of the third differential current.

4. The integrated circuit of claim 1, further comprising:
   a power rail;
   a first resistance coupled between the power rail and the first terminal of the differential current output of the first differential transconductor; and
   a second resistance coupled between the power rail and the second terminal of the differential current output of the first differential transconductor.

5. The integrated circuit of claim 1, further comprising:
   a first averaging circuit having a first input coupled to the first input voltage component lead, a second input coupled to the second input voltage component lead, and an output;
   a second averaging circuit having a first input coupled to the first terminal of the differential voltage output, a second input coupled to the second terminal of the differential voltage output, and an output; and
   a control circuit having a first input coupled to the output of the first averaging circuit, a second input coupled to the output of the second averaging circuit, and an output coupled to an input of the differential current source.

6. The integrated circuit of claim 5,
   wherein the first averaging circuit is configured to generate a first average signal indicative of a common mode voltage of an input signal carried by the first and second input voltage component leads,
   wherein the second averaging circuit is configured to generate a second average signal indicative of a common mode voltage of a differential voltage signal produced by the differential current-to-voltage converter, and wherein the control circuit is configured to control a common mode component of a differential current produced by the differential current source based on the first and second average signals.

7. The integrated circuit of claim 6, wherein the control circuit is configured to control the common mode component of the differential current so as to cause the common mode voltage of the input signal to be substantially equal to the common mode voltage of the differential voltage signal.

8. The integrated circuit of claim 1, further comprising:
a first current-to-voltage converter having an input coupled to the first terminal of the differential current output of the first differential transconductor; and
a second current-to-voltage converter having an input coupled to the second terminal of the differential current output of the second differential transconductor.

9. The integrated circuit of claim 1, further comprising:
a data generator coupled to the first and second input voltage component leads;
a driver circuit coupled to the outputs of the first and second differential transconductors; and
an electrical-to-optical converter coupled to the driver circuit.

10. A method comprising:
generating a first differential current;
generating a differential voltage based on the first differential current;
generating a second differential current based on a first component of an input signal and a first component of the differential voltage;
generating a third differential current based on a second component of the input signal and a second component of the differential voltage;
generating a first component of a fourth differential current based on a first component of the second differential current and a first component of the third differential current; and
generating a second component of the fourth differential current based on a second component of the second differential current and a second component of the third differential current, wherein the input signal is indicative of data to be optically transmitted, wherein the fourth signal is an electrical signal, the method further comprising:
converting the fourth signal to an optical signal.

11. A device comprising circuitry configured to:
generate a first differential current;
generate a differential voltage based on the first differential current;
generate a second differential current based on a first component of an input signal and a first component of the differential voltage;
generate a third differential current based on a second component of the input signal and a second component of the differential voltage;
generate a first component of a fourth differential current based on a first component of the second differential current and a first component of the third differential current; and
generate a second component of the fourth differential current based on a second component of the second differential current and a second component of the third differential current.

* * * * *